United States Patent [19]

Yamashita et al.

[11] Patent Number: 4,967,782
[45] Date of Patent: Nov. 6, 1990

[54] PROCESS AND APPARATUS FOR RECOVERING AND REUSING RESIST COMPOSITION

[75] Inventors: Asaaki Yamashita, Saitama; Kiyoto Mori, Kasukabe; Tsugio Saito, Fujisawa; Shiro Shimauchi, Tokyo, all of Japan

[73] Assignee: Kanto Kagaku Kabushiki Kaisha, Tokyo, Japan

[21] Appl. No.: 251,224

[22] PCT Filed: Dec. 25, 1987

[86] PCT No.: PCT/JP87/01035
§ 371 Date: Aug. 25, 1988
§ 102(e) Date: Aug. 25, 1988

[87] PCT Pub. No.: WO88/05179
PCT Pub. Date: Jul. 14, 1988

[30] Foreign Application Priority Data

Dec. 25, 1986 [JP] Japan ................................. 61-307767

[51] Int. Cl.$^5$ ............................................ G05D 24/02
[52] U.S. Cl. ..................................... 137/92; 427/345
[58] Field of Search ...................... 137/4, 92; 118/688; 427/345

[56] References Cited

U.S. PATENT DOCUMENTS

| 2,711,750 | 6/1955 | Norcross | 137/92 |
| 3,831,616 | 8/1974 | Weyers | 137/92 |
| 4,426,877 | 1/1984 | Srivasta | 137/92 X |

FOREIGN PATENT DOCUMENTS 57-166033 10/1982 Japan .
58-166721 10/1983 Japan .
59-9654 1/1984 Japan .

Primary Examiner—Robert G. Nilson
Attorney, Agent, or Firm—Birch, Stewart, Kolasch & Birch

[57] ABSTRACT

The present invention relates to a tank for use in recovering and reusing resist compositions, which comprises (a) means for measuring the viscosity of a previously used resist composition introduced into the recovery tank; (b) line means for feeding a solvent into the recovery tank; (c) line means for introducing the previously used resist composition into the recovery tank; (d) line means for discharging the viscosity adjusted resist composition from the recovery tank; and (e) means for opening the solvent feed line means described above in (b) when the viscosity as measured by the viscosity measuring means described above in (a) is higher than a predetermined viscosity, and means for closing the same when the predetermined viscosity is reached.

7 Claims, 1 Drawing Sheet

PROCESS AND APPARATUS FOR RECOVERING AND REUSING RESIST COMPOSITION

BACKGROUND OF THE INVENTION

1. Field of the Invention

The present invention relates to recovering and reusing, while applying resist composition onto silicon wafers to form thin films thereon, the resist composition scattered from a spinner and no longer usable on the silicon wafer.

More particularly, this invention relates to a process and apparatus for recovering the scattered unused resist composition as mentioned above for reuse.

2. Discussion of the Prior Art

Resist compositions are used in large volumes, for example, in semiconductor industries or in printing industries. For example, resist compositions are used to manufacture integrated circuits, e.g. by the spin-coating technique whereby they are applied, by means of a spinner or the like, to silicon wafers to form thin films. With this technique of coating silicon wafers, however, more than 90% of the resist composition used is scattered without being coated on the silicon wafers, resulting in waste liquid having no use. As a matter of fact, the waste liquid is collected and commissioned to industrial waste disposal workers for disposal.

From the standpoint of efficient utilization of resources, the inventors have made extensive studies on a process and an apparatus for recovering for reuse such resist compositions otherwise disposed of as waste liquid, and succeeded in providing a process for recovering for reuse such resist composition waste liquid as mentioned above as well as an apparatus therefor.

SUMMARY OF THE INVENTION

Thus, the present invention provides a process and an apparatus as mentioned below, which make it possible to recover and reuse resist composition scatters in silicon wafer coating.

The process according to the present invention comprises:

(1) collecting resist composition scattered from a spinner (2) introducing the resist composition into a recovery tank maintained under a constant temperature (thermostatic) condition;

(3) measuring the viscosity of the recovered resist composition in the recovery tank;

(4) introducing, in accordance with the result of the measurement, a solvent until the resist composition shows a predetermined viscosity;

(5) discontinuing the solvent supply at the point of time when the resist composition has reached the predetermined viscosity;

(6) transferring the resist composition with the predetermined viscosity to a storage tank; and (7) forwarding, whenever necessary, the resist composition from the storage tank to a coating chamber for reuse in silicon wafer coating.

The present invention also provides an apparatus to be used for the process mentioned above.

The apparatus according to the invention comprises a resist composition recovering tank characterized by being provided with the following means and lines a) - e):

(a) a means to maintain the tank under a constant temperature condition;

(b) a means to measure the viscosity of the resist composition introduced as waste liquid, i.e. composition scattered from the spinner without being used;

(c) a transmittal means to transmit the result of the measurement by the viscosity measuring means to the opening/closing action of a valve placed in a passage through which to feed solvent replenishments in such a manner that the valve opens when the result of the measurement of the viscosity of the composition is higher than a predetermined viscosity and closes when it has reached the predetermined viscosity;

(d) a line through which to introduce thereinto the resist composition recovered as waste liquid; and (e) a line through which to discharge therefrom the resist composition with the predetermined viscosity.

BRIEF DESCRIPTION OF THE INVENTION

The process and apparatus according to the present invention will now be illustrated in more detail with reference to the attached drawing.

FIG. 1 in the attached drawing is a schematic representation of the process and apparatus, of the present invention.

DETAILED DESCRIPTION OF THE INVENTION

Figure 1:
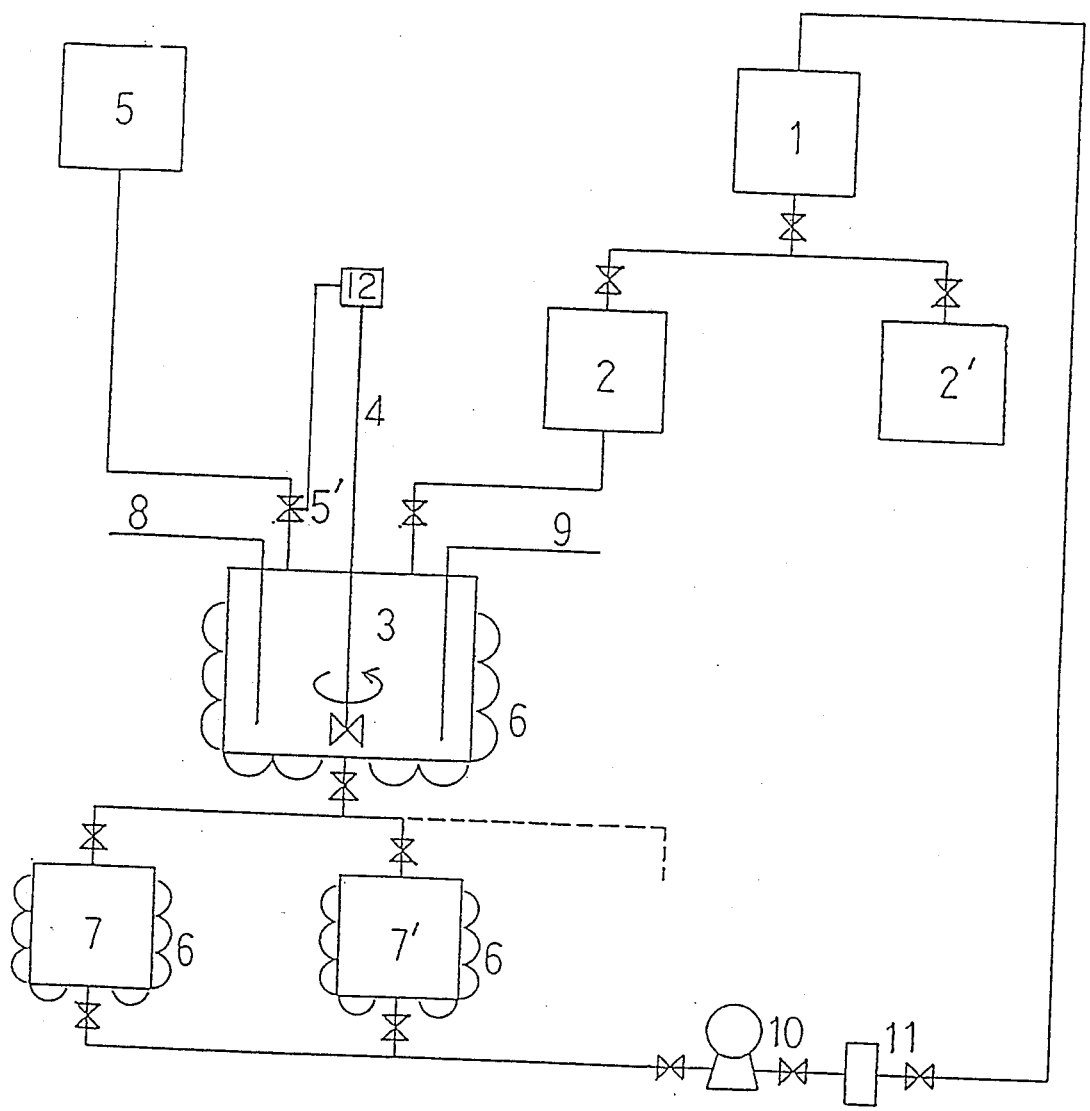

In the drawing, 1 is a coating chamber where a resist composition is applied by means of a spinner to a silicon wafer to form its thin films thereon. The resist composition scattered from the spinner without being used on the silicon wafer during application of the resist composition to the wafer in the coating chamber, hereinafter referred to as "waste liquid composition", is collected and introduced into a preliminary recovery tank 2. The waste liquid composition is then led from the preliminary recovery tank 2 into a recovery tank 3. The recovery tank 3 is provided with a means 6 to maintain it under a constant temperature condition and a means 4 to homogenize the waste liquid composition and means 12 to measure constantly its viscosity. The viscosity measuring means 12 so interlocks with an opening/closing means for a valve 5' with which to control the solvent supply from a solvent supply tank 5, through a means to transmit the viscosity measurement result in the form of electric signals to the opening/closing means, that the valve 5' opens or closes in response to the viscosity level of the waste liquid composition. Thus, the valve 5' opens, when the viscosity of the waste liquid composition in the recovery tank 3 is higher than a predetermined viscosity, to initiate the solvent feed, and it closes, when the viscosity of the waste liquid composition has reached the predetermined viscosity, to discontinue the solvent feed. The recovery tank 3 is preferably provided with a thermometer 8 with which to measure the temperature of the composition.

The resist composition in the context of the present invention refers to those resist compositions widely used in semiconductor industries or printing industries, including photosensitive resins dissolved in solvents. Resin components in such compositions include generally commercially available negative- or positive-photoresists and electron ray or X-ray resists; for example, negative-type photoresists such as OMR-83 and -85 (Tokyo Ohka Kogyo), CIR-701 and -707 and CBR-M901 (Japan Synthetic Rubber), KMR-747 (Nagase Sangyo) and WAYCOAT IC-T3 and SC (Fuji Hunt); positive-type photoresists such as OFPR-800 and -5000, TSMR-8800 (Tokyo Ohka Kogyo), PFR-3600 and -3003B (Japan Synthetic Rubber) and NPR-809 and -820 (Nagase Sangyo), HPR-204 (Fuji Hunt) and MPR-1350J and -111 (Shipley); electron ray or X-ray resists such as CMS (Toso), MES (Japan Synthetic Rubber), EBR-9 (Toray) and OEBR-1000 (Tokyo Ohka Kogyo).

As solvents for such resin components are used, depending upon the type of the resin component, glycol ethers, glycol ether esters, aromatic hydrocarbons, ketones, ethers, fatty acids, alcohols, esters, lactones and the like. Suitable solvents include, for example, glycol ethers such as ethylene glycol monomethyl ether (methyl cellosolve), diethylene glycol monomethyl ether, ethylene glycol monoethyl ether (ethyl cellosolve), diethylene glycol monoethyl ether and diethylene glycol dibutyl ether; cellosolve esters such as methyl cellosolve acetate, ethyl cellosolve acetate and butyl cellosolve acetate; aromatic hydrocarbons such as toluene and xylene; ketones such as methyl ethyl ketone, methyl isobutyl ketone, cyclohexanone, acetonylacetone, acetophenone and isophorone; ethers such as benzyl ethyl ether, 1,2-butoxyethane and dihexyl ethers; fatty acids such as caproic acid and caprylic acid; alcohols such as 1-octanol, 1-nonanol, 1-decanol and benzylalcohol; esters such as ethyl acetate, butyl acetate, 2-ethylhexyl acetate, benzyl acetate, benzyl benzoate, diethyl oxalate, dibutyl oxalate, diethyl malonate, dibutyl maleate, diethyl maleate, dimethyl phthalate, ethylene carbonate and propylene carbonate; and lactones such as $\gamma$-butyrolactone.

These solvents may be used either alone or in combination. It is preferred to use such hydrocarbon solvents as xylene for negative-type photoresists, and 2-ethoxyethyl acetate (cellosolve acetate), either alone or in mixture with xylene and butyl acetate, for positive-type photoresists. In view of the influence of cellosolve solvents on the human health recently coming into question, use of different solvent mixtures has been proposed.

The amount of such organic solvents used in resist compositions cannot be specified since it depends upon various factors, for example, the type and concentration of the resin component and the required resist film thickness. By way of example, in resist compositions with positive-type photoresists as the resin component, the general resin component-to-solvent ratio is 100 parts by weight to 100–2,000, preferably 300–1,500, parts by weight.

The solvent to be used for the treatment mentioned above is identical in kind or composition with a single or mixed solvent in the resist composition initially used for forming its thin films on silicon wafers, and the above mentioned "predetermined viscosity" is used to mean the viscosity of the initially used resist composition.

After viscosity adjustment in the above described recovery tank 3, the resist composition now with a predetermined viscosity is introduced into a storage tank 7 where it is stored for reuse. From the storage tank 7 the resin composition is forwarded, whenever its use is required, to the coating chamber 1 for repeated use in silicon wafer coating, after, passing through a filter 11 for removal of undesirable fine particles and the like possibly present in the composition. If necessary, and preferably, a plurality of storage tanks are installed (as indicated by 7').

The preliminary recovery tank 2 mentioned above is not essential to the process and apparatus according to the present invention, but it is preferred to install this as far as it renders possible continuous operation of the process of the invention. The volume of the waste liquid composition to be introduced into the recovery tank 3 is adjusted by means of a volumeter 9. The type of volumeter 9 preferably used includes those units capable of electrically sensing the liquid volume, for example, such liquid level sensors or electrostatic sensors as are normally used for liquid volume measurement. The volume thus recognized through perception by the volumeter 9 is transmitted as electric signals so as to control the waste liquid composition transfer from the preliminary recovery tank 2 to the recovery tank 3.

Another preliminary recovery tank 2' may be installed in order to adjust the volume of waste liquid volume transferred.

In the recovery tank 3, the waste liquid composition is kept at a constant temperature using a thermostatic means 6. Thermostatic means 6 include those normally used as an electrical means to keep the interior of the recovery tank 3 at a constant temperature. The waste liquid composition kept at a constant temperature is continuously subject to measurement for its viscosity by a viscosity measuring means 12. The valve 5' for solvent supply is made to open or close in accordance with the viscosity measured. Thus, for example, a viscosity measuring means 12 using a rotation viscometer is so interlocked with a means to transmit measurement results obtained therewith as electric signals to a valve 5' opening/closing means. The above mentioned waste liquid composition recovered after use in the coating operation has an elevated viscosity as a result of solvent evaporation. In order to add solvent thereto to make its viscosity identical with that of the original resist composition, fresh solvent is supplied into the recovery tank 3. The formulation as to the kind and composition of the solvent is determined in accordance with the solvent formulation for the original resist composition. If the viscosity of the waste liquid composition in the recovery tank has reached that of the original resist composition, then the signals from the viscosity measuring means 4 are transmitted to a valve opening/closing means to close the valve 5' resulting in discontinuation of the solvent supply to the recovery tank 3. In the foregoing, the transfer of waste liquid compositions or solvents in the system according to the present invention can be achieved by choosing an appropriate method from among those means usually employed for their transfer, such as with a pump 10 or through pressure feed using nitrogen gas. The resist composition whose viscosity has been adjusted in the recovery tank 3 is transferred to storage tanks (7,7') where it is stored for reuse.

According to the process and apparatus of the present invention, almost all the resist composition scattered during coating with a spinner can be recovered without being disposed of and regenerated through viscosity adjustment into a resist composition with a predetermined formulation. Thus, the present invention brings about excellent results, for example, a reduction in labor and cost, in addition to efficient utilization of resources.

We claim:

1. A recovery tank for recovering and reusing a resist composition by collecting resin composition scattered from a spinner during application of a resist composition onto silicon wafers which will be disposed of as a waste liquid, introducing collected resist composition into a recovery tank, measuring the viscosity of the resist composition in the recovery tank, introducing a solvent into the recovery tank in accordance with the measured viscosity of the resist composition until the resist composition shows a predetermined viscosity, discontinuing the solvent supply when the viscosity of the resist composition has reached the predetermined viscosity, and removing, whenever necessary, the viscosity adjusted resist composition, for reuse: said recovery tank comprising:

(a) means for measuring the viscosity of a previously used resist composition introduced into said recovery tank;

(b) line means for feeding a solvent into the recovery tank;

(c) line means for introducing the previously used resist composition into the recovery tank;

(d) line means for discharging the viscosity adjusted resist composition from the recovery tank; and (e) means for opening the solvent feed line means described above in (b) when the viscosity as measured by the viscosity measuring means described above in (a) is higher than a predetermined viscosity, and means for closing the same when the predetermined viscosity is reached.

2. The recovery tank of claim , which contains a previously used resist composition.

3. A resist composition recovery tank, which comprises:

(a) viscosity measuring means for measuring the viscosity of a previously used resist composition introduced into said resist composition recovery tank;

(b) means for feeding a solvent into said resist composition recovery tank;

(c) means for introducing the previously used resist composition into said resist composition recovery tank;

(d) means for discharging the viscosity adjusted resist composition from the resist composition recovery tank; and (e) means for opening means (b) when the viscosity as measured by means (a) is higher than a predetermined viscosity, and means for closing means (b) when the predetermined viscosity is reached.

4. The recovery tank of claim 3, which contains a previously used resist composition.

5. The recovery tank of claim 3, wherein the resist composition is a negative photoresist, a positive photoresist, an electron ray resist or an X-ray resist.

6. The recovery tank of claim 3, wherein the solvent is selected from the group consisting of glycol ethers, glycol ether esters, aromatic hydrocarbons, ketones, ethers, fatty acids, alcohols, esters, lactones and mixtures thereof.

7. The recovery tank of claim 3, wherein the solvent is selected from the group consisting of ethylene glycol monomethyl ether, diethylene glycol monoethyl ether, ethylene glycol monoethyl ether, diethylene glycol monoethyl ether, diethylene glycol dibutyl ether, methyl cellosolve acetate, ethyl cellosolve acetate, butylcellosolve acetate, toluene, xylene, methyl ether ketone, methyl isobutyl ketone, cyclohexanone, acetonylacetone, acetophenone, isophorone, benzyl ethyl ether, 1,2-butyoxyethane, dihexyl ethers, caproic acid, caprylic acid, 1-octanol, 1-nonanol, 1-decanol, benzylalcohol, ethyl acetate, butyl acetate, 2ethylhexyl acetate, acetate, benzyl benzoate, diethyl oxalate, dibutyl oxalate, diethyl malonate, dibutyl maleate, diethyl maleate, dimethyl phthalate, ethylene carbonate, propylene carbonate, γ-butyrolactone, and mixtures thereof.

* * * * *